United States Patent
Baumgartner et al.

(10) Patent No.: US 9,715,564 B2
(45) Date of Patent: Jul. 25, 2017

(54) SCALABLE AND AUTOMATED IDENTIFICATION OF UNOBSERVABILITY CAUSALITY IN LOGIC OPTIMIZATION FLOWS

(71) Applicant: International Business Machines Corporation, Armonk, NY (US)

(72) Inventors: Jason R. Baumgartner, Austin, TX (US); Raj K. Gajavelly, Warangal (IN); Ashutosh Misra, Lucknow (IN); Pradeep K. Nalla, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/924,898

(22) Filed: Oct. 28, 2015

(65) Prior Publication Data

US 2017/0124240 A1    May 4, 2017

(51) Int. Cl.
*G06F 17/50* (2006.01)
*G06F 9/45* (2006.01)

(52) U.S. Cl.
CPC .............. *G06F 17/5045* (2013.01)

(58) Field of Classification Search
CPC .............. G06F 17/505; G06F 2217/08; G06F 17/5045; G06F 17/5072
USPC ........................... 716/103, 132, 135
See application file for complete search history.

(56) References Cited

U.S. PATENT DOCUMENTS

| | | | |
|---|---|---|---|
| 6,311,317 B1 | 10/2001 | Khoche et al. | |
| 6,728,945 B1 | 4/2004 | Wang | |
| 6,834,376 B2 | 12/2004 | Wada | |
| 7,360,181 B2 | 4/2008 | Baumgartner et al. | |
| 7,657,689 B1 | 2/2010 | Crosland et al. | |
| 7,913,208 B2 * | 3/2011 | Baumgartner | G06F 17/504 716/101 |
| 8,042,085 B2 | 10/2011 | Rahim et al. | |
| 8,146,034 B2 | 3/2012 | Baumgartner et al. | |

(Continued)

OTHER PUBLICATIONS

Hamid Savoj, Alan Mishchenko, and Robert Brayton. m-Inductive Properties of Logic Circuits. pp. 1-8. University of California, Berkeley, CA, USA.

(Continued)

*Primary Examiner* — Nghia Doan
(74) *Attorney, Agent, or Firm* — Gibb & Riley, LLC; Steven J. Meyers

(57) ABSTRACT

A method for performing redundancy identification in an integrated circuit design. An optimized gate in a logic circuit is identified. A first netlist with a representation of the logic circuit is generated. An error is induced on the optimized gate. A second netlist is generated from a copy of the first netlist incorporating changes based on the error. Fan-out boundaries of the logic circuit are propagated for the first and second netlists. A redundancy report representing optimization steps performed to obtain the original logic circuit is analyzed to identify which steps are adequate to cause unobservability of the optimized gate. This is done by representing the optimization steps as constraints over the first and second netlists. Responsive to the error becoming undetectable under the constraints derived from the redundancy report, a minimal set of reductions is identified from the first netlist as the reason for unobservability of the optimized gate.

20 Claims, 13 Drawing Sheets

(56) References Cited

U.S. PATENT DOCUMENTS

| | | | |
|---|---|---|---|
| 8,543,962 B2 | 9/2013 | Jarrett | |
| 8,578,306 B2 | 11/2013 | Manohararajah | |
| 8,589,837 B1 | 11/2013 | Baumgartner et al. | |
| 2007/0136701 A1* | 6/2007 | Baumgartner | G06F 17/504 716/103 |
| 2010/0293513 A1* | 11/2010 | Baumgartner | G06F 17/505 716/103 |
| 2012/0167022 A1 | 6/2012 | Herzl et al. | |

OTHER PUBLICATIONS

Stephen Plaza, Kai-Hui Chang, Igor Markov, and Valeria Bertacco. Node Mergers in the Presence of Don't Cares. Jul. 6, 2006, pp. 1-18. University of Michigan, Computer Science and Engineering Division, Department of Electrical Engineering and Computer Science, Ann Arbor, Michigan.

Katarzyna Radecka and Zeljko Zilic. Identifying Redundant Gate Replacements in Verification by Error Modeline. pp. 803-812. 2001 IEEE. ITC International Test Conference. McGill University, Montreal, Canada.

Hari Mony, Jason Baumgartner, Alan Mishchenko, & Robert Brayton. Speculative Reduction-Based Scalable Redundancy Identification. pp. 1-6. IBM Systems & Technology Group, Austin, TX & Department of EECS, University of California, Berkeley, USA.

Andreas Kuehlmann. Dynamic Transition Relation Simplification for Bounded Property Checking. pp. 50-57. Cadence Berkeley Labs, Berkeley, CA, USA.

Maxim Teslenko & Elena Dubrova. A Fast Heuristic Algorithm for Redundancy Removal. Mar 23, 2015. pp. 1-7. Ericsson Research, Stockholm, Sweden & Dept. of Electronic and Embedded Systems, Royal Institute of Technology—KTH Stockholm, Sweden.

Alan Mishchenko & Robert Brayton. Recording Synthesis History for Sequential Verification. pp. 1-8. Department of EECS, University of California, Berkeley, CA, USA.

Qi Zhu, Nathan Kitchen, Andreas Kuehlmann & Alberto Sangiovanni-Vincentelli. SAT Sweeping with Local Observability Don't-Cares. pp. 229-234. DAC Jul. 2006. University of California at Berkeley, CA, USA & Cadence Berkeley Labs, Berkeley, CA, USA.

Jason Baumgartner, Hari Mony, Adnan Aziz. Optimal Constraint-Preserving Netlist Simplification. pp. 1-9. IEEE 2008. IBM Systems and Technology Group, The University of Texas at Austin, Austin TX USA.

* cited by examiner

```
Compute_Redundancy_Reason (netlist N, gate g, Redundancy_Report R,
Set Min_Boundary) {

Set Boundary = {g};
    Set Visited_Set = {g};
    Set Necessary_Reductions = {}; // empty set
    Netlist N1 = N; // create a copy
```

FIG. 3A

```
While (!Timeout) {
    Set New_PO = (Min_Boundary != {}) ?
        GetNearest_UnoptimizedFanoutGateSet(N1, Visited_Set, Boundary, R) :
    Min_Boundary;

NC = createCopy(N1, New_PO);//only includes logic in fan-in of New_PO
    NC2 = induceInverterAtGateOutput(NC, g); // alter function of g
    M = createMiterCircuit(N1, NC2, New_PO);

//see if g is in the redundancy report independently of any merges
    m_status = verify(M);
    if (m_status == PASS) {
        if (Necessary_Reductions == {} ) {
            report g is a merge-independent reduction
            break;
        } else if (Min_Boundary != {}) {
            return Necessary_Reductions;
        }
        else { // use recursive call to possibly further minimize Necessary_Reductions relative
               //to final adequate New_PO
            return Compute_Redundancy_Reason(N, g, Necessary_Reductions, New_PO);
        }
    }
    // else altered g causes mismatch relative to New_PO; see which
    // reductions in R masked it
```

FIG. 3B

```
//Project R to smaller NC
R2 = structuralFilter(NC, R);

// Perform BMC check to identify minimal set of reductions to block
m_status.trace
Netlist ud = unrollT(M, depth(m_status.trace), input values(m_status.trace));
//constrain unrolling input values to those seen in m_status.trace.
Though this constraining is optional
    Set Merge_Constraints = {};

for each simplification/merge "m" in R2 {
    // add constraint reflecting the reduction m in NC copy in M
    Merge_Constraints = Merge_Constraints + {M.NC.m};
}
```

FIG. 3C

```
status = verify(ud + Merge_Constraints);

if (status == FAIL) {
    // obtained a counterexample showing a mismatch on New_PO
    // given altered behavior of g. Extend New_PO boundary deeper
    traceM = simulate(M, status.trace);
    Boundary = {gates which differ in N1 vs NC2 along traceM};
    Visited_Set = Visited_Set + Boundary;
    continue;
}
else { // status == PASS; Timeouts abort overall loop
    // see which reductions were necessary to obtain a proof of equivalence
    // of N1 vs NC
    unsat_core = unsatCore(status.proof);
    R3 = extractReductionConstraints(unsat_core);
```

FIG. 3D

```
Necessary_Reductions = Necessary_Reductions + R3;

N1 = apply_merges(N1, R3); // to simplify later processing
ud = apply_merges(ud, R3);

R = R – R3;      // R3 no longer needs to be analyzed
R2 = R2 – R3;    // since we know they are necessary
}
} // end of while loop
} // end of Logic_Redundancy_Reason
```

FIG. 3E

```
GetNearest_UnoptimizedFanoutGateSet (Netlist N1, Set Visited_Set,
Queue Boundary, Redundancy_Report R) {
Set Unoptimized_Set = {}; // empty set
Set New_Boundary = {};

While (Boundary != {}) {
  fo_gate= pop(Boundary); // remove an element from Boundary for each fanout gate "f" of fo_gate {
    if ( f is not in Visited_Set ) {
      Visited_Set.add (f);

if ("f" is not in R, or "f" is a primary output) {
        Unoptimized_Set = Unoptimized_Set + {f};
      } else {
        New_Boundary = New_Bounadary + {f};
      }
    }
  }
}
```

FIG. 5A

```
if (Q == {} && Unoptimized_Set == {} ) { // both empty
    Boundary = New_Boundary;
    New_Boundary = {};
  }
}
return Unoptimized_Set;
}
```

FIG. 5B

SCALABLE AND AUTOMATED IDENTIFICATION OF UNOBSERVABILITY CAUSALITY IN LOGIC OPTIMIZATION FLOWS

BACKGROUND

The present disclosure relates to verification techniques for integrated circuit logic design and more particularly to identification of unobservability causality in logic optimization flows.

Redundancy in logic designs is undesirable, entailing unnecessary overhead in area and power. Types of logic redundancy include: logic which fall out of the COI (cone-of-influence) of any primary output or otherwise is "unobservable", logical gates which are functionally equivalent to constant 0/1, logical gates which are functionally equivalent to each other, and logical gates which become unobservable after other simplifications. It is good practice to uncover as much redundancy as possible in the early phase of design cycle, which can be eliminated to save overall budget (area, power, timing, etc.) of the chip. This is particularly essential in a design reuse framework, where logic components may be reused in multiple chips, possibly under different reconfigurations or input/output conditions. Additionally, it can be valuable in high-level design exploration, where one may wish to explore area tradeoffs when reconfiguring a design component in various ways.

To identify redundancy, there exist numerous methods. Combinational optimizations refer to those that do not leverage any sequential design information, e.g., unreachable states: they only affect combinational logic assuming that any state is reachable. Sequential optimizations may alter sequential logic (e.g., latches), and may leverage sequential design information such as unreachable states to yield greater reductions than those possible using combinational analysis alone.

A sequential redundancy identification flow has been proposed that works in an assume-then-prove paradigm. Such a flow will first guess the redundancy candidates, next select a representative register/gate, and then create a speculatively-reduced netlist by merging fan-out references of every redundancy candidate with a reference to its representative candidate. To ensure the validity of the guessed redundancy, a miter (i.e., a proof obligation, in the form of an exclusive OR gate) is added between each candidate and its representative. Finally, each miter is proven as valid, or disproven as invalid in which case the speculative-reduced netlist must be refined due to error in the guessed redundancy. Combinational satisfiability (SAT) sweeping detects and merges nodes that are equivalent in a combinational network. This work offers a subset of the reductions possible with the sequential redundancy identification technique. Observability Don't Care (ODC) based SAT sweeping is a technique where it is possible to merge two gates that are not strictly functionally equivalent, if whenever those two gates are inequivalent, their inequivalence can be demonstrated to not be observable at some fan-out boundary. Such reductions are a superset of the so-called Cone of Influence reduction, where logic outright falls out of the structural fan-in of any design outputs. Another method using sequential optimization based on eliminating inductively unobservable state variables has also been proposed.

While all design optimization techniques have the aforementioned benefits in reducing design area, power consumption, etc.—the use of sequential reductions for design optimization in an automated flow are challenging in practice. For example, in certain design redundancy is deliberate and desired, e.g., to facilitate late design changes (Engineering Change Orders) or runtime-configurable design resilience functionality in case of silicon failures, or to reduce circuit propagation delays. Additionally, most design methodologies require the use of combinational equivalence checking on the pre- vs. post-synthesis models, which may be violated if sequential optimizations are performed. Additionally, the design latches are often relevant to initialization logic, post-Silicon analysis logic, Design for Test functionality, etc. Hence, most design methodologies limit automated optimization techniques to be combinational. Nonetheless, sequential optimizations are more powerful than combinational. In the design optimization realm, such sequential transforms may often be performed manually, ideally using automatically generated optimization reports to guide the designer in their Hardware Description Language (HDL) editing. In such flows, it is desirable to apply these algorithms as early as possible in the design cycle to provide feedback to the designers for manual HDL optimization. Additionally, such transformations may be used to reduce verification runtime, since verification complexity is generally exponential in design size.

While numerous transformations are available for logic optimization, what is lacking is a solution that can identify the cause of why a particular optimization was possible. Most notably, it is generally the case that performing one optimization enables another, that may not have been possible without the former optimization. For example, merging a pair of functionally equivalent gates may cause other gates to become unobservable. It is also noteworthy that, for efficiency, it is often the case that a large number of optimization steps are performed concurrently within a logic optimization flow; performing one optimization at a time would not only be prohibitive from a scalability perspective (many vs. one logic optimization run), but also since limiting each run to a single optimization step would likely become prohibitively expensive, e.g., in a speculative-reduction based sequential redundancy removal flow, the scalability benefit enabled by speculative reduction of a single redundancy is significantly less than the scalability benefit enabled by speculative reduction of many redundancies.

SUMMARY

In this disclosure we present a highly scalable automated algorithm to assess the reason for unobservability of a logic gate (or gates), within a logic optimization or verification flow. This has applications in logic optimization, high-level design space exploration, and test bench debugging in a verification setting.

According to a method for identifying causality of gate unobservability within an optimized logic circuit, an unoptimized logic circuit and an optimized version of the logic circuit are received. A redundancy report representative of the optimized logic circuit is received. An optimized gate in the optimized logic circuit is identified. A first netlist comprising a representation of the unoptimized logic circuit is generated. An error is induced on the optimized gate. A second netlist comprising a copy of the first netlist based on the error is generated. Fan-out boundaries of the unoptimized logic circuit are propagated for the first netlist and the second netlist. The fan-out boundaries reflect reductions performed on the optimized logic circuit within the first netlist and the second netlist relative to the fan-out boundaries. A redundancy report representing a plurality of optimization steps performed to obtain the original optimized logic circuit is analyzed to identify which optimizations are adequate to cause the unobservability of the optimized gate. This is done by representing the optimization steps as constraints over the first netlist and the second netlist. Responsive to the error becoming undetectable under the constraints derived from the redundancy report, a minimal set of reductions is identified from the first netlist as the reason for unobservability of the optimized gate.

According to a method for performing redundancy identification in an integrated circuit design using a data processing system, a first netlist for an integrated circuit design is received by the data processing system. An error is induced by the data processing system on an optimized gate of the integrated circuit design. A second netlist for an integrated circuit design based on the error is generated by the data processing system. Fan-out boundaries of the integrated circuit design for the first netlist and the second netlist are incrementally determined by the data processing system. A redundancy report representing the optimization steps performed to obtain the original optimized logic circuit is analyzed by the data processing system and the optimization steps that cause unobservability of the optimized gate are identified. The optimization steps are represented as constraints over the first netlist and the second netlist by the data processing system. Responsive to the error becoming undetectable under the constraints derived from the redundancy reports, a minimal set of reductions from the first netlist is identified by the data processing system as the reason for unobservability of the optimized gate.

According to a computer program product for performing redundancy identification in an integrated circuit design, the computer program product comprises a computer readable storage medium having program instructions embodied therewith. The program instructions are readable/executable by a processor to cause the processor to perform a method. According to the method, an optimized gate in an optimized logic circuit for an integrated circuit design is identified. A first netlist is generated. The first netlist comprises a representation of the logic circuit. An error is induced on the optimized gate. A second netlist is generated. The second netlist comprises a copy of the first netlist based on the error. Fan-out boundaries of the logic circuit are propagated for the first netlist and the second netlist. The fan-out boundaries reflect reductions performed on the integrated circuit design within the first netlist and the second netlist relative to the fan-out boundaries. A redundancy report representing a plurality of optimization steps performed to obtain the original optimized logic circuit is analyzed to identify which optimizations are adequate to cause the unobservability of the optimized gate. This is done by representing the optimization steps as constraints over the first netlist and the second netlist. Responsive to the error becoming undetectable under the constraints derived from the redundancy reports, a minimal set of reductions is identified from the first netlist as the reason for unobservability of the optimized gate.

BRIEF DESCRIPTION OF THE DRAWINGS

The devices and methods herein will be better understood from the following detailed description with reference to the drawings, which are not necessarily drawn to scale and in which:

FIGS. 3A-3E are exemplary pseudo-code listings associated with FIG. 2 according to devices and methods herein;

FIGS. 5A-5B are exemplary pseudo-code listings associated with FIG. 4 according to devices and methods herein;

DETAILED DESCRIPTION

Figure 1:
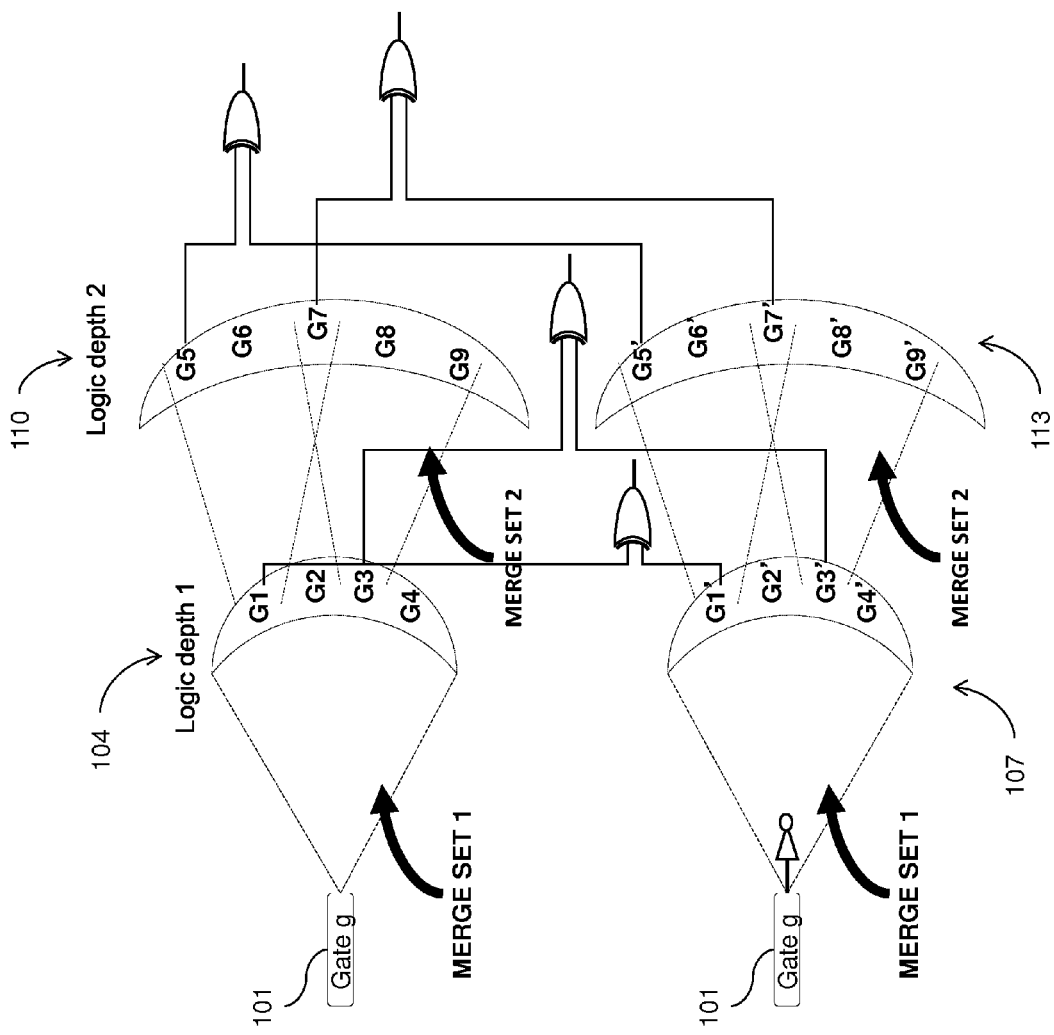
FIG. 1 is a high-level overview of a process according to devices and methods herein.
Figure 2:
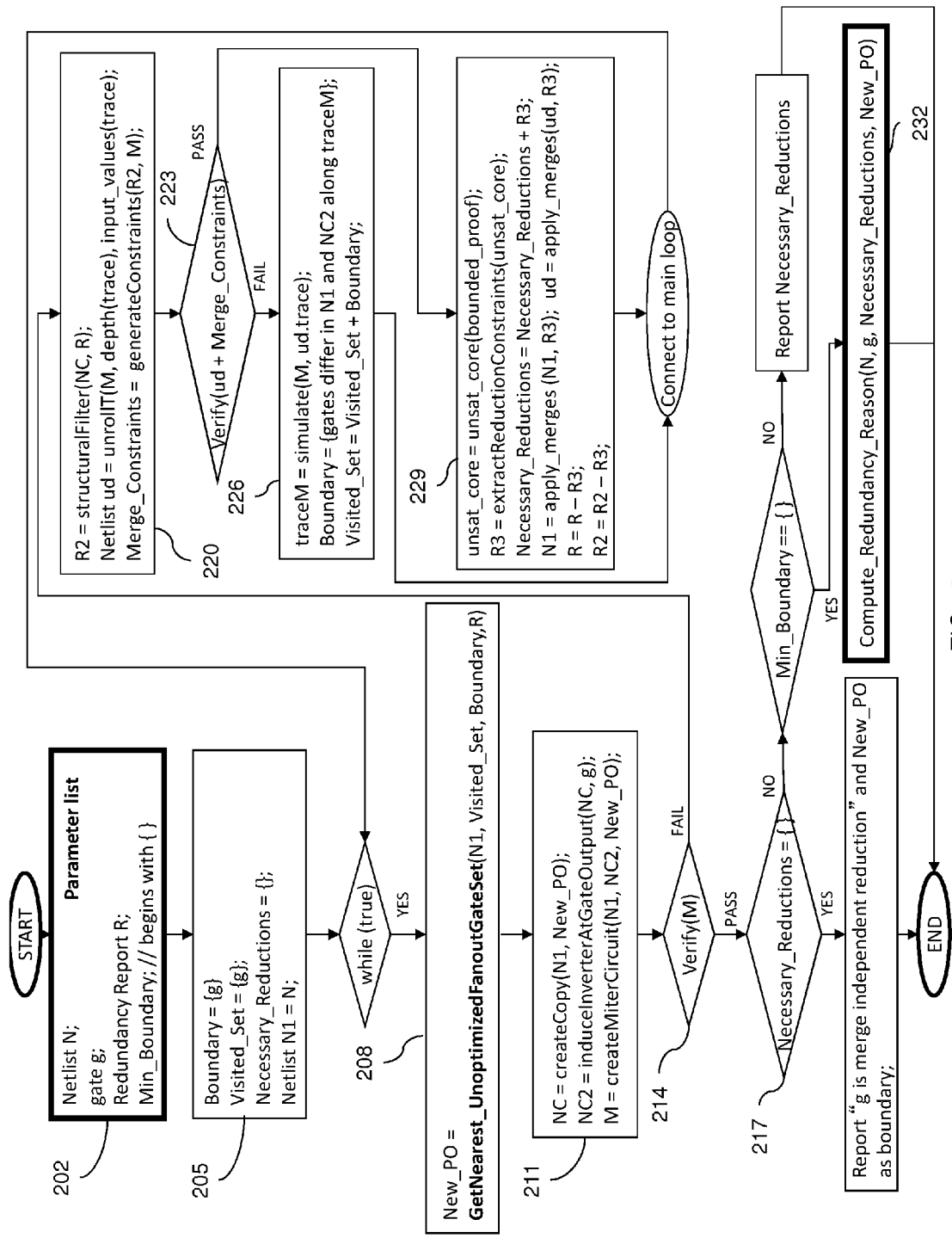
FIG. 2 is an exemplary flow chart showing identification of optimizations according to devices and methods herein.

The disclosure will now be described with reference to a method of logic chip design where the logic undergoes synthesis and any gates found to be redundant have information recorded explaining what prior synthesis steps were done to make the gate redundant. If the logic is changed later, errors can be avoided by checking if the conditions for the gate being redundant still exist. While the disclosure will be described hereinafter in connection with specific devices and methods thereof, it will be understood that limiting the disclosure to such specific systems and methods is not intended. On the contrary, it is intended to cover all alternatives, modifications, and equivalents as may be included within the spirit and scope of the disclosure as defined by the appended claims.

When manually optimizing a design under guidance of an optimization report, it is sometimes highly desirable to understand the reason why a particular optimization was possible—e.g., to understand design exploration tradeoffs. For example, if a secondary optimization is only enabled due to a prior optimization, and it is determined that the prior optimization cannot be performed for some reason (e.g., a deliberate design redundancy as outlined above), it straightforwardly follows that the secondary optimization cannot be performed. Otherwise, the secondary transformation may be attempted, and cause later problems such as design flaws. Additionally, sometimes an optimization is enabled by a design flaw, or in a verification setting, due to a test bench setup flaw (e.g., constraints over design inputs to avoid spurious fails). It is thus advantageous in various settings (logic optimization and verification, for example) to have an understanding of why a particular optimization is deemed valid. Despite this broad set of applications, very little prior art has addressed this problem.

Additionally, in a verification setting, it is sometimes valuable to identify why a particular piece of logic becomes irrelevant to a test bench, to identify whether a possible design flaw or test bench overconstraint was the cause.

One format for recording synthesis transformation history records all logic arising during the course of a synthesis flow with information about which gates are equivalent along this flow. However, the sole purpose of this data is to make equivalence checking of pre-synthesis vs. post-synthesis models more scalable. As such, it has no support to record the causality between the synthesis steps as desired in the above-mentioned application space. Additionally, it does not address transformations such as unobservability-based optimizations; instead, it is focused on dedicated logic rewriting techniques.

In this disclosure we present a highly scalable automated process to assess the reason for unobservability of a logic gate (or gates), within a logic optimization or verification flow. This has applications in logic optimization, high-level design space exploration, and test bench debugging in a verification setting.

For a general understanding of the features of the disclosure, reference is made to the drawings. In the drawings, like reference numerals have been used throughout to identify identical elements.

FIG. 1 shows a high-level overview of a process according to devices and methods herein. First, a netlist format is defined. A netlist contains a finite directed graph with vertices representing gates, such as gate g 101, and edges representing interconnections between those gates. The gates have associated functions, such as constants, primary inputs (hereafter referred to as RANDOM gates), combinational logic such as AND gates, and sequential elements (hereafter referred to as registers). Registers have two associated components: their next-state functions, and their initial-value functions. Both are represented as other gates in the graph. Semantically, for a given register, the value appearing at its initial-value gate at time "0" ("initialization" or "reset" time) will be applied as the value of the register itself; the value appearing at its next-state function gate at time "i" will be applied to the register itself at time "i+1". A set of valuations to all registers in a netlist is called a "state".

Certain gates may be labeled "properties" correlating to verification objectives such as "is it ever possible to transition the netlist from an initial state to a state which asserts the property gate," or " . . . to a state in which a gate may be stuck asserted forever." Other gates may be labeled as "constraints" that are used to "artificially" limit the stimulus that can be applied to the RANDOM gates of the design. In particular, when searching for a way to drive a "1" to a property gate, the verification process must adhere to the rule that "every constraint gate must evaluate to a logical 1 for every time-step up to, and including, the time-step at which the property gate is asserted". Finally, certain gates may be labeled as primary outputs (POs) whose behavior must be preserved by logic optimizations in a synthesis setting. Generally speaking, in a synthesis environment, primary outputs are the ultimate boundary at which logic optimization is performed relative to (e.g., in terms of unobservability). In a verification environment, the properties and constraints are the ultimate boundary. Generally speaking, a netlist represents the composition of a design under test, and any "test bench" type of logic representing properties, input constraints/drivers, etc., relevant to a verification or synthesis run.

A redundancy report "R" may comprise the following types of reductions:
1. Gate "g" is equivalent to constant 0/1.
2. Gate "g1" is equivalent to, and has been merged onto, another gate "g2".
3. Gate "g" is unobservable at any primary output, possibly due to other optimizations.
4. Gate "g" is an input constraint from a verification test bench.

According to devices and methods herein, a netlist is created for the logic circuit including gate g 101. The fan-out boundaries for a first logic depth are indicated at 104. A copy of the netlist is created by inducing an error (inversion) on gate g 101, and the fan-out boundaries for a first logic depth for the inversion are indicated at 107. At each fan-out boundary 104, 107, a redundancy report 'R' is analyzed to identify which optimization causes gate g 101 to become redundant. Fan-out boundaries may be incrementally, minimally propagated, such as shown at the second logic depths for gate g 101 and the inversion, indicated at 110 and 113, respectively. The fan-out boundaries may continue to be propagated until the inversion becomes undetectable.

The actual simplifications reported in R can be the result of ODC based optimizations, combinational redundancy removal such as SAT sweeping, sequential redundancy removal, etc. Note that both in synthesis and verification settings, the design may be composed with input constraints to restrict the behaviors of the netlist that the design should be analyzed with respect to. For example, the design clock may be driven by an oscillator, "scan mode" or "reset" may be disabled or driven very specifically, etc. In one embodiment of the invention, input constraints may further be labeled as such in the redundancy report, and analyzed along with other optimization steps to identify which input constraints may be necessary to determine the cause of unobservability of a given optimized gate.

As discussed above, since a large number of individually logic optimization steps are often performed concurrently, it is not the case that merely ordering the above steps chronologically could offer a reliable method to pinpoint which equivalence is the cause of which unobservability. It is further a complication that one or more unobservability-based reductions enable later equivalences, and/or later unonbservabilities, with arbitrary sequencing and interleavings.

According to devices and methods herein, the reason that a particular unobservable gate "g" 101 is included in a redundancy report, in terms of other logic optimization steps can be derived. A straightforward extension of the process supports this query for a set of gates.

FIGS. 2 and 3A-3E show a flowchart and pseudo code for the logic redundancy reasoning process according to devices and methods herein. In other words, the flow chart and pseudo code of FIGS. 2 and 3A-3E respectively, may be used for identification of which optimizations caused gate "g" 101 to become redundant. The process starts at 202 with defining the parameter list. After the netlist N has been defined, the boundary and sets are initialized at 205. The remainder of the first step is to choose a fan-out boundary against which to check a redundancy cause using Function GetNearest_UnoptimizedFanoutGateSet described below, unless a set Min_Boundary is provided. Once we have this set, we will use it as an artificial Primary Output set (New_PO), for N1, emulating a smaller circuit against which redundancy is to be checked for greater efficiency (208). The next step is to create a copy of the original circuit N1, represented as NC. Once we have NC, we invert the gate g 101 output in NC to change the function of that gate, and that forms the new netlist NC2. Once we have two copies of netlist N1 (original) and NC2 (copy with gate g 101 inverted), we create a miter circuit, at 211. The miter circuit is created by putting exclusive-or (XOR) checks on artificial Primary Outputs we have created and check whether these miter properties can be asserted (indicating a functional mismatch between N1 and NC2 relative to New_PO) or proven as unassertable (in which case the different behavior of gate g 101 is not observable at New_PO) 214. In the latter case, we halt the process by reporting that Necessary_Reductions are a minimal set to explain why gate g 101 is unobservable. If Necessary_Reductions is empty (217), this indicates that gate g 101 is redundant independently of any other reductions.

We next get a minimized version of the original redundancy report R by projecting it to only signals in the smaller netlist NC, resulting in R2 (220).

The subsequent steps are to identify which merges caused the unobservability of gate g 101, as those that are able to block the trace showing the mismatch of New_PO between N1 and NC. This step, at 220, consists of unrolling the miter netlist M for the duration of this trace to obtain unrolled netlist "ud", forcing the unrolling to adhere to the input patterns from the trace, and verifying 223. "Unrolling" refers to creating a combinational representation of the behavior of a sequential netlist for a specific number of timeframes (here, equal to the length of the trace), by duplicating every gate in the sequential netlist once per timeframe; driving the state variables at timeframe "i+1" by their next-state function gates at timeframe "i", and driving the state variables at time 0 by their initial value gate. RANDOM gates copied at time "j" are replaced by the constant values witnessed in the trace at the corresponding timeframe. The resulting unrolling may be analyzed using a technique such as a Boolean satisfiability (SAT) solver, checking whether the unrolled version of a property may be asserted within the corresponding timeframes. This process is commonly referred to as "bounded model checking" (BMC). By construction, the resulting problem as such would FAIL (i.e., the gate representing the XOR over New_PO in the failing timeframe of the trace would be asserted), as this directly constitutes the behavior witnessed in the trace representing a FAIL on the original verification step. Though we additionally reflect all merges from reduction report R2 into the unrolled problem. This would be guaranteed to result in a PASS if New_PO equals the original PO set against which R was computed. Though, since New_PO represents a smaller boundary, it is possible that BMC with all these will still result in a FAIL, requiring a deeper New_PO boundary 226. The new boundary will be computed from the resulting trace, reflecting the shallowest boundary at which no mismatches across N1 and NC are witnessed. However, if the result is PASS, we analyze a minimal "unsatisfiable core" from the resulting bounded model-checking problem (using a SAT solver) to identify a minimal number of merges adequate to block the prior mismatch trace 229. An "unsatisfiable core" is a subset of logic analyzed by the SAT solver that is adequate to guarantee unsatisfiability of the entire problem. It is additionally noteworthy that for this process, the merges are reflected in the unrolling as "constraints" vs. structural transformations, otherwise such unsatisfiability information would not be derivable from the SAT solver. Any merge deemed necessary in this step is added in the report that will be returned in the minimal explanation for the reason of gate g's unobservability. Accordingly, they are removed as candidates from R and R2, and unconditionally added to N1 and ud (as per blocks 200 and 229), to accelerate later processing.

It is finally noteworthy that the resulting minimal explanation, Necessary_Reductions, may end up larger than necessary in the case that multiple iterations of the overall loop (computing different New_PO's) occur, with unsatisfiable cores existing across iterations. This is because a particular reduction may be necessary to make gate g 101 unobservable at a shallower boundary, but may be unnecessary to make gate g 101 unobservable at a deeper boundary. It is thus suggested to perform one additional refinement step of this process (i.e., calling Compute_Redundancy_Reason an additional time), using Necessary_Reductions as the redundancy set to be analyzed and minimized, and using the current New_PO as the Min_Boundary against which redundancy is checked 232. The first call to Compute_Redundancy_Reason uses an empty Min_Boundary, to be able to derive a minimal boundary.

Figure 4:
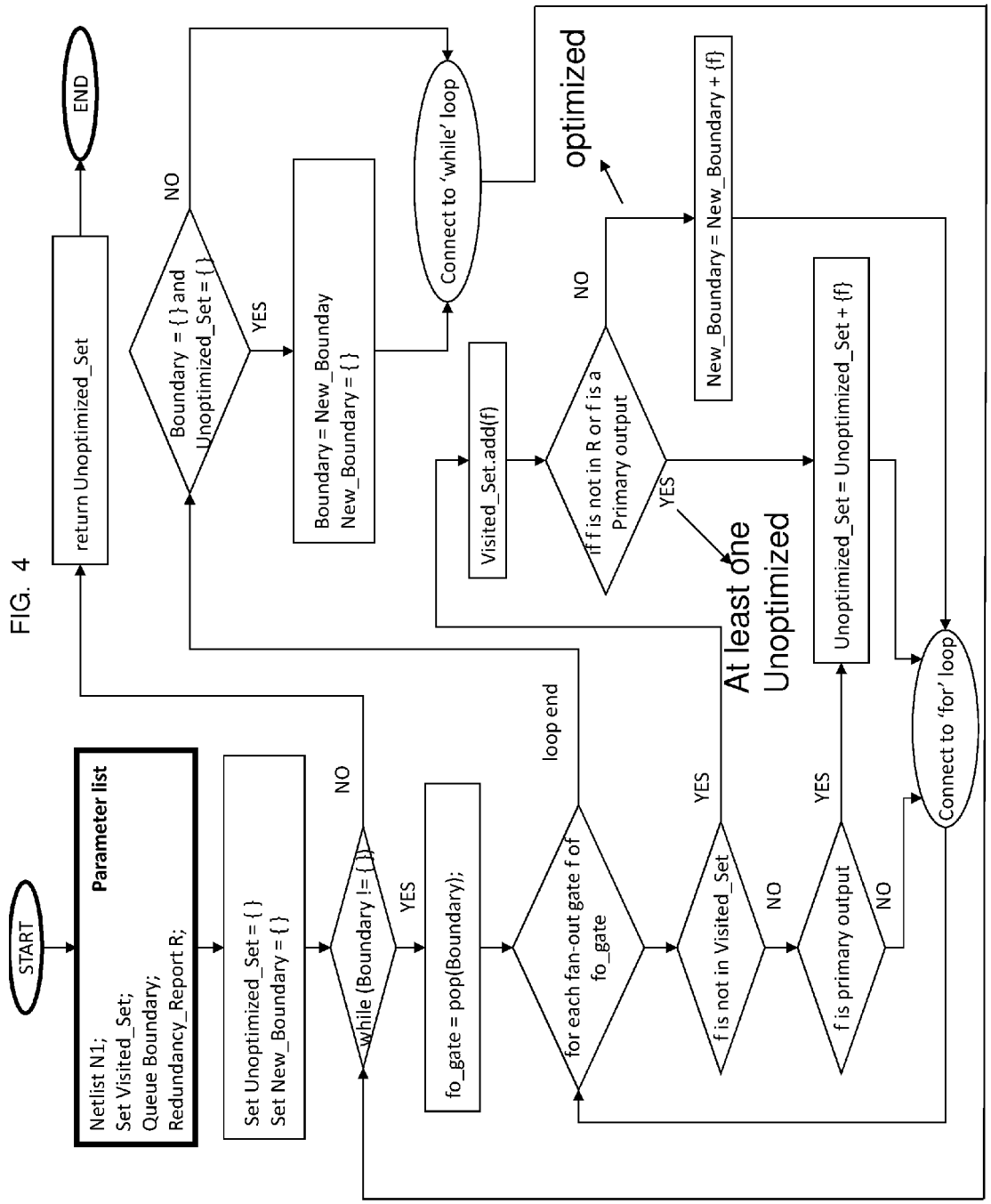
FIG. 4 is an exemplary flow chart showing fan-out enumeration according to devices and methods herein.

FIGS. 4 and 5A-5B show a flowchart and pseudo code for determining the breadth of first unoptimized fan-out gate enumeration. Function GetNearest_UnoptimizedFanoutGateSet is used to enumerate the fan-out of gate g 101 to be analyzed for its cause of redundancy. There is a desire to keep this fan-out boundary minimal, since the greater the distance between gate g 101 and the chosen boundary, the greater the computational expense of the redundancy cause check. Though conversely, by choosing a boundary too near, the redundancy cause check will fail and require a refinement step to move the boundary further. For this reason, in practice, it may be desired that the "fan-out gate" analysis be done in greater increments, such as at register boundaries. Though note that when a failing trace is observed relative to a chosen too-minimal of New_PO, the boundary is placed adequately far fan-out-wise to eliminate all mismatches exhibited in that trace.

In other words, a logic optimization flow according to devices and methods herein includes receiving an original, unoptimized circuit. A set of techniques is performed to optimize the circuit and a redundancy report is generated. A process disclosed herein is used to determine a reason why a particular gate has become unobservable during the course of optimizing the original circuit. Methods herein return a minimal subset from the original redundancy report, which are adequate to cause the optimized gate to become unobservable.

Figure 6:
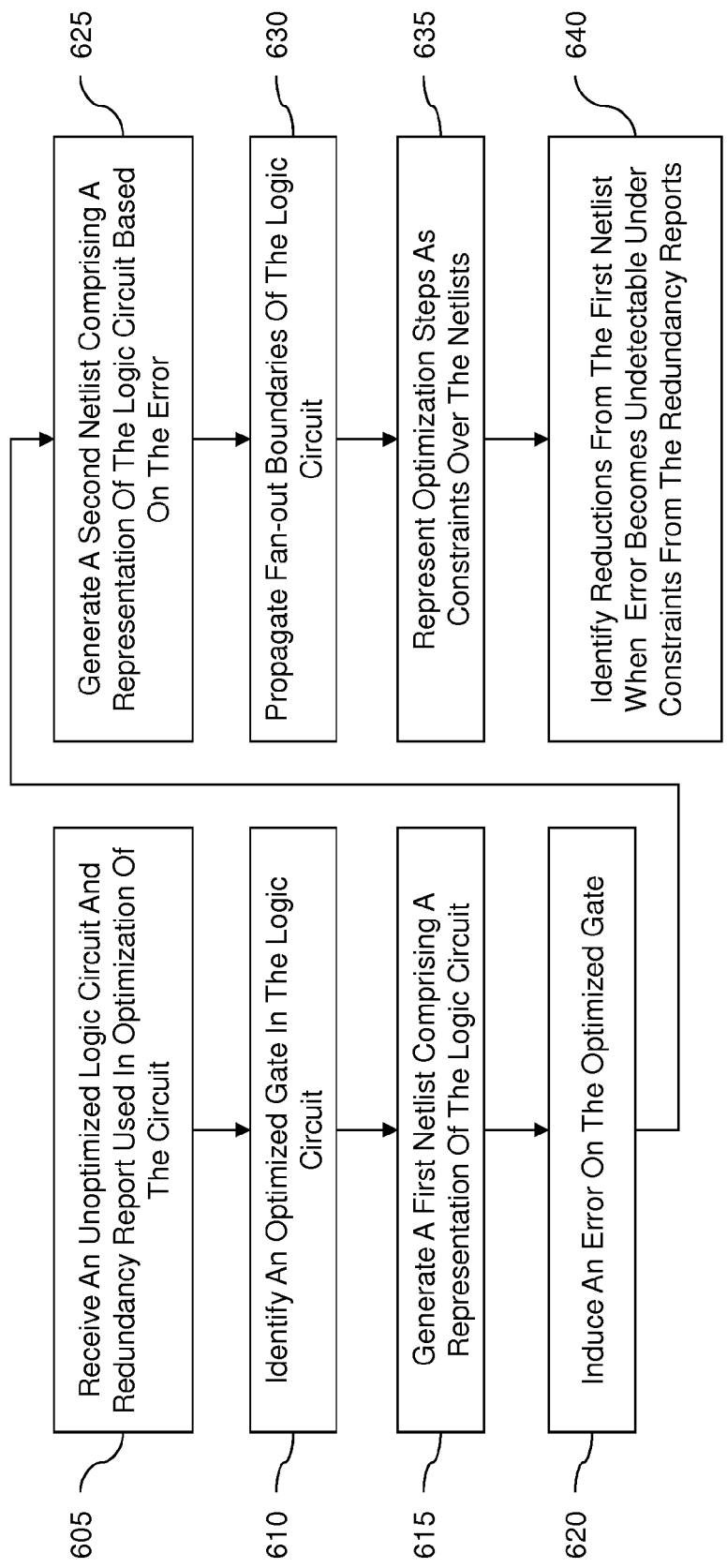
FIG. 6 is a flow diagram according to devices and methods herein.

FIG. 6 is a flow diagram illustrating the processing flow of an exemplary method for performing redundancy identification in an integrated circuit design using a data processing system according to devices and methods herein. At 605, an unoptimized logic circuit and redundancy report used in optimization of the circuit are received. At 610, an optimized gate in the logic circuit is identified. A first netlist comprising a representation of the logic circuit is generated, at 615. An error is induced on the optimized gate, at 620. A second netlist comprising a copy of the first netlist based on the error is generated, at 625. Fan-out boundaries of the logic circuit are propagated for the first netlist and the second netlist, at 630. At 635, the optimization steps are represented as constraints over the first netlist and the second netlist. At 640, responsive to the error becoming undetectable under the constraints derived from the redundancy reports, reductions are identified from the first netlist as the reason for unobservability of the optimized gate.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
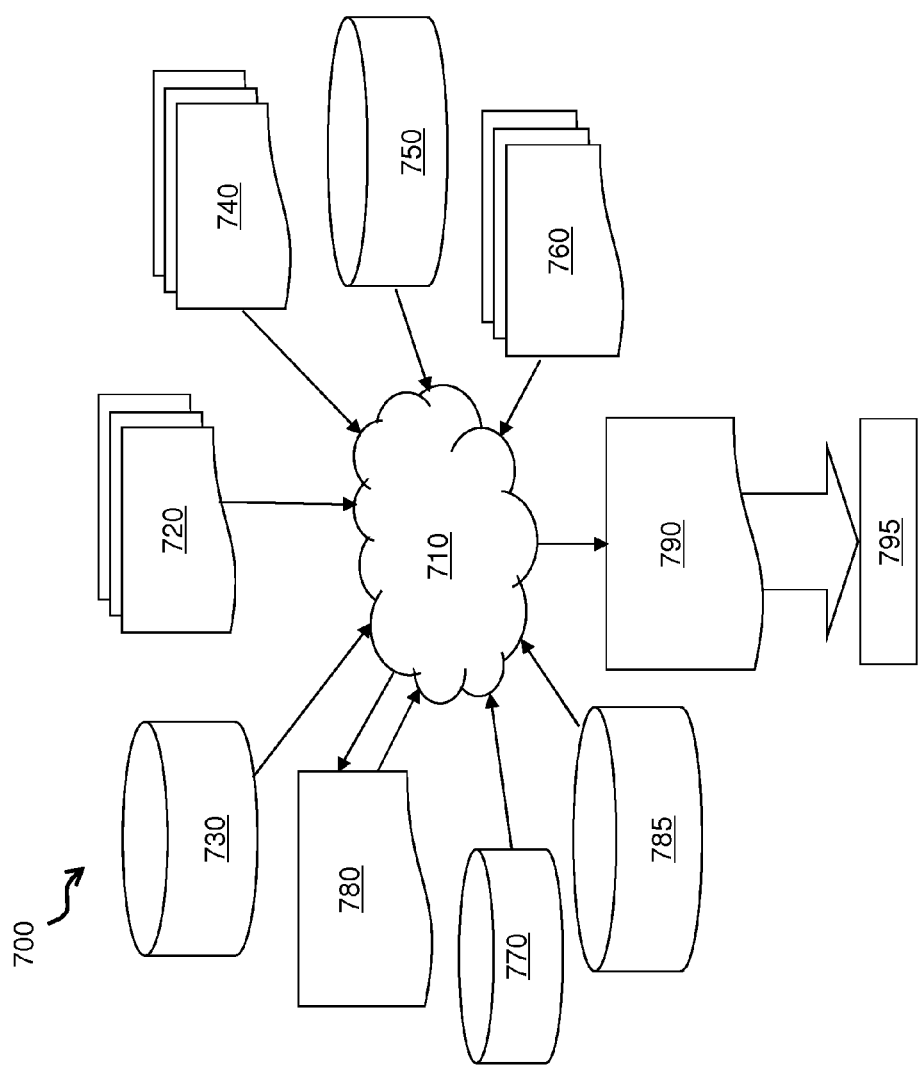
FIG. 7 is a block diagram illustrating an exemplary design flow used, for example, in the logic design, simulation, test, layout, and manufacture of the structures disclosed herein.

FIG. 7 shows a block diagram of an exemplary design flow 700 used for example, in semiconductor IC logic design, simulation, test, layout, and manufacture. Design flow 700 includes processes, machines, and/or mechanisms for processing design structures or devices to generate logically or otherwise functionally equivalent representations of the design structures and/or devices described above and shown in FIGS. 1-5. The design structures processed and/or generated by design flow 700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 1-5. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 1-5 to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which Netlist 780 is resynthesized one or more times depending on design specifications and parameters for the device. As with other design structure types described herein, Netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 790 may comprise a compiled, executable HDL simulation model that functionally simulates the devices shown in FIGS. 1-5.

Design structure 790 may also employ a data format used for the exchange of layout data of integrated circuits and/or symbolic data format (e.g., information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 790 may then proceed to a stage 795 where, for example, design structure 790: proceeds to tape-out, is released to manufacturing, is released to a mask house, is sent to another design house, is sent back to the customer, etc.

Aspects of the present disclosure are described herein with reference to flowchart illustrations and/or block diagrams of methods, apparatus (systems), and computer program products according to devices and methods herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
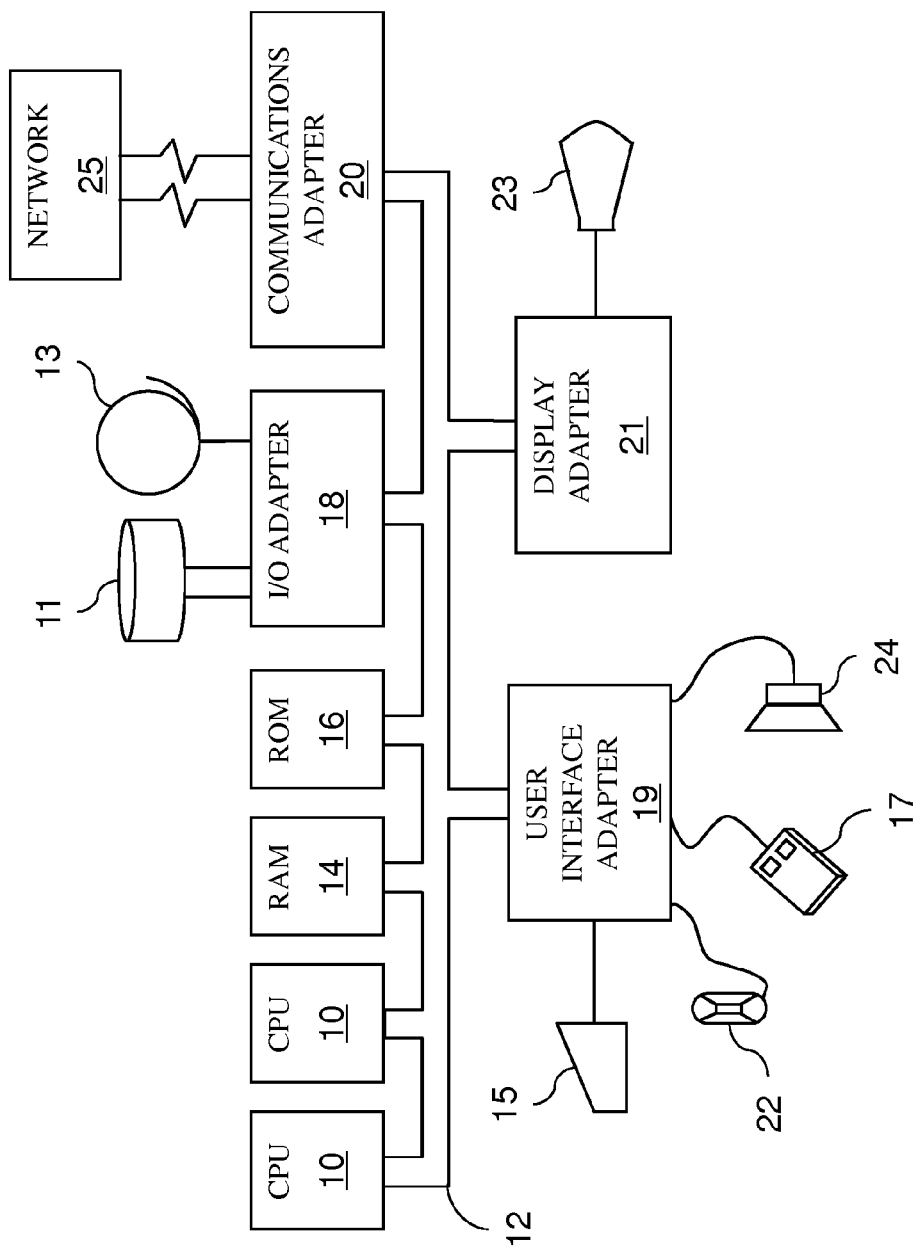
FIG. 8 is a schematic diagram illustrating an exemplary hardware system that can be used in the implementation of the design flow according to devices and methods herein.

A representative hardware environment for implementing the devices and methods herein is depicted in FIG. 8. This schematic drawing illustrates a hardware configuration of an information handling/computer system in accordance with the devices and methods herein. The system comprises at least one processor or central processing unit (CPU) 10. The CPUs 10 are interconnected via system bus 12 to various devices such as a Random Access Memory (RAM) 14, Read Only Memory (ROM) 16, and an Input/Output (I/O) adapter 18. The I/O adapter 18 can connect to peripheral devices, such as disk units 11 and tape drives 13, or other program storage devices that are readable by the system. The system can read the instructions on the program storage devices and follow these instructions to execute the methodology of the devices and methods herein.

In FIG. 8, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing or the like is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 including a network interface card such as a LAN card, a modem, or the like connects the bus 12 to a data processing network 25. The communication adapter 20 performs communication processing via a network such as the Internet. A display adapter 21 connects the bus 12 to a display device 23, which may be embodied as an output device such as a monitor (such as a Cathode Ray Tube (CRT), a Liquid Crystal Display (LCD), or the like), printer, or transmitter, for example.

The flowchart and block diagrams in the Figures illustrate the architecture, functionality, and operation of possible implementations of systems, methods, and computer program products according to various examples disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises," "comprising," and/or "including," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present disclosure have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A method for identifying causality of gate unobservability within an optimized logic circuit comprising:
   receiving an unoptimized version of a logic circuit and an optimized version of said logic circuit;
   identifying an optimized gate in said optimized version of said logic circuit;
   generating a first netlist, said first netlist comprising a representation of said unoptimized version of said logic circuit;
   inducing an error on said optimized gate;
   generating a second netlist, said second netlist comprising a copy of said first netlist reflecting changes to said unoptimized version of said logic circuit based on said error on said optimized gate;
   propagating fan-out boundaries of said unoptimized version of said logic circuit for said first netlist and said second netlist, said fan-out boundaries reflecting reductions performed on said optimized version of said logic circuit within said first netlist and said second netlist relative to said fan-out boundaries;
   analyzing a redundancy report representing a plurality of optimization steps performed to obtain said optimized version of said logic circuit, said analyzing identifying which optimization steps are adequate to cause unobservability of said optimized gate; and
   responsive to said error becoming undetectable at said fan-out boundaries under constraints derived from said redundancy report, identifying a minimal set of reductions from said first netlist.

2. The method according to claim 1, wherein said minimal set of reductions identify reasons for unobservability of said optimized gate.

3. The method according to claim 1, said error comprising inversion of the output of said optimized gate.

4. The method according to claim 1, said propagating fan-out boundaries comprising incrementally stepping the output of said optimized gate through depths of logic.

5. The method according to claim 4, each incremental step comprising a minimum step for each level of logic.

6. The method according to claim 1, further comprising:
   creating a miter circuit between said first netlist and said second netlist; and
   comparing output properties of said first netlist and said second netlist.

7. The method according to claim 6, further comprising:
   reflecting individual reductions from said redundancy report through addition of reduction constraints on unrolled circuit representation of miter with respect to said fan-out boundaries; and
   identifying minimal unsatisfiable subsets of said reduction constraints when miscompare has been eliminated under said reflected reductions accumulating an adequate set of original reductions necessary to eliminate a plurality of miscompares relative to a plurality of logic boundaries.

8. The method according to claim 7, further comprising:
   minimizing the accumulated adequate sets of original reductions to yield a minimal adequate set of reductions sufficient to cause unobservability of said optimized gate.

9. A method, in a data processing system, for performing redundancy identification in an integrated circuit design, said method comprising:
   receiving, by said data processing system, a first netlist for an integrated circuit design;
   inducing, by said data processing system, an error on an optimized gate of said integrated circuit design;
   generating, by said data processing system, a second netlist for said integrated circuit design reflecting changes to said first netlist based on said error;
   determining, by said data processing system, fan-out boundaries of said integrated circuit design for said first netlist and said second netlist;
   analyzing, by said data processing system, redundancy reports representing optimization steps performed to obtain optimization of said integrated circuit design, said analyzing identifying which optimization steps are adequate to cause unobservability of said optimized gate;
   representing, by the data processing system, said optimization steps as constraints over said first netlist and said second netlist; and
   responsive to said error becoming undetectable at said fan-out boundaries under said constraints derived from said redundancy reports, identifying, by said data processing system, a minimal set of reductions from said first netlist.

10. The method according to claim 9, said minimal set of reductions identifying reasons for unobservability of said optimized gate.

11. The method according to claim 9, said error comprising inversion of the output of said optimized gate.

12. The method according to claim 9, said determining fan-out boundaries comprising incrementally stepping the output of said optimized gate through depths of logic, each incremental step comprising a minimum step for each level of logic.

13. The method according to claim 9, further comprising:
   creating a miter circuit between said first netlist and said second netlist, said creating a miter circuit comprising putting XOR checks on the output of said first netlist and said second netlist; and
   comparing output properties of said first netlist and said second netlist.

14. The method according to claim 13, further comprising:
   reflecting individual reductions from said redundancy report through addition of reduction constraints on unrolled circuit representation of miter with respect to said fan-out boundaries;

identifying minimal unsatisfiable subsets of said reduction constraints when miscompare has been eliminated under said reflected reductions accumulating an adequate set of original reductions necessary to eliminate a plurality of miscompares relative to a plurality of logic boundaries; and minimizing the accumulated adequate sets of original reductions to yield a minimal adequate set of reductions sufficient to cause unobservability of said optimized gate.

15. A non-transitory computer program product for performing redundancy identification in an integrated circuit design, said computer program product comprising a computer readable storage medium having program instructions embodied therewith, the program instructions being readable and executable by a computerized device to cause said computerized device to perform a method comprising:

identifying an optimized gate in a logic circuit for an integrated circuit design;

generating a first netlist, said first netlist comprising a representation of said logic circuit;

inducing an error on said optimized gate;

generating a second netlist, said second netlist comprising a copy of said first netlist reflecting changes to said representation of said logic circuit based on said error;

propagating fan-out boundaries of said logic circuit for said first netlist and said second netlist, said fan-out boundaries reflecting reductions performed on said integrated circuit design within said first netlist and said second netlist relative to said fan-out boundaries;

analyzing a redundancy report representing a plurality of optimization steps performed to obtain an optimized logic circuit for said integrated circuit design, said analyzing identifying which optimizations are adequate to cause unobservability of said optimized gate;

representing said optimization steps as constraints over said first netlist and said second netlist; and responsive to said error becoming undetectable at said fan-out boundaries under said constraints derived from said redundancy report, identifying a minimal set of reductions from said first netlist.

16. The computer program product according to claim 15, said error comprising inversion of the output of said optimized gate.

17. The computer program product according to claim 15, said propagating fan-out boundaries comprising incrementally stepping the output of said optimized gate through depths of logic, each incremental step comprising a minimum step for each level of logic.

18. The computer program product according to claim 15, said method further comprising:

creating a miter circuit between said first netlist and said second netlist; and comparing output properties of said first netlist and said second netlist.

19. The computer program product according to claim 18, said method further comprising:

reflecting individual reductions from said redundancy report through addition of reduction constraints on unrolled circuit representation of miter with respect to said fan-out boundaries; and identifying minimal unsatisfiable subsets of said reduction constraints when miscompare has been eliminated under said reflected reductions accumulating an adequate set of original reductions necessary to eliminate a plurality of miscompares relative to a plurality of logic boundaries.

20. The computer program product according to claim 19, said method further comprising:

minimizing the accumulated adequate sets of original reductions to yield a minimal adequate set of reductions sufficient to cause unobservability of said optimized gate.

* * * * *